US007022947B2

(12) United States Patent
Yamaguchi et al.

(10) Patent No.: US 7,022,947 B2
(45) Date of Patent: Apr. 4, 2006

(54) SYSTEMS FOR SUPPORTING CERAMIC SUSCEPTORS

(75) Inventors: Kazuaki Yamaguchi, Ama-District (JP); Yoshinobu Goto, Nagoya (JP); Hideyoshi Tsuruta, Tokai (JP)

(73) Assignee: NGK Insulators, Ltd., Nagoya (JP)

( * ) Notice: Subject to any disclaimer, the term of this patent is extended or adjusted under 35 U.S.C. 154(b) by 0 days.

(21) Appl. No.: 10/884,294

(22) Filed: Jul. 2, 2004

(65) Prior Publication Data

US 2005/0006374 A1 Jan. 13, 2005

(30) Foreign Application Priority Data

Jul. 10, 2003 (JP) ............................ 2003-194791

(51) Int. Cl.
*F27B 5/14* (2006.01)

(52) U.S. Cl. ...................... 219/390; 219/405; 219/411; 219/444.1; 219/443.1; 219/446.1; 392/416; 392/418; 118/724; 118/725; 118/50.1

(58) Field of Classification Search ................ 219/390, 219/405, 411, 444.1, 443.1, 446.1; 392/416, 392/418; 118/724, 725, 50.1
See application file for complete search history.

(56) References Cited

U.S. PATENT DOCUMENTS

| | | | |
|---|---|---|---|
| 6,261,708 B1 | 7/2001 | Ohashi et al. | |
| 6,705,394 B1 * | 3/2004 | Moslehi et al. ............. | 165/206 |

FOREIGN PATENT DOCUMENTS

| | | |
|---|---|---|
| JP | 05-326112 | 12/1993 |
| JP | 2001-250858 A1 | 9/2001 |

OTHER PUBLICATIONS

U.S. Appl. No. 11/064,406, filed Feb. 23, 2005, Goto et al.

* cited by examiner

*Primary Examiner*—Shawntina Fuqua
(74) *Attorney, Agent, or Firm*—Burr & Brown

(57) ABSTRACT

A support structure for supporting a ceramic susceptor in a chamber is provided. The support structure includes a supporting portion joined with a back face of the ceramic susceptor. The supporting portion includes an inner space that is separated from the atmosphere of the chamber. A cooling system is provided below the supporting portion 6. At least one thermal control portion is provided between the cooling system and the supporting portion for reducing thermal conduction from the susceptor to the cooling system.

8 Claims, 5 Drawing Sheets

SYSTEMS FOR SUPPORTING CERAMIC SUSCEPTORS

This application claims the benefits of Japanese Patent Application P2003-194791, filed on Jul. 10, 2003, the entirety of which is incorporated by reference.

BACKGROUND OF THE INVENTION

1. Field of the Invention

The invention relates to a structure for supporting a ceramic susceptor.

2. Related Art Statement

In applications such as semiconductor production system, it is demanded to fix a ceramic heater made of, for example, aluminum nitride, onto the inner wall surface of a chamber. It has been tried to fix one end of a tubular supporting portion made of a ceramic plate onto a joining face of a ceramic heater and to the other end of the supporting portion onto the inner wall surface of the chamber. The supporting portion is formed of a heat resistive ceramic plate such as alumina or aluminum nitride. The supporting portion and chamber are sealed in air tight manner with an O-ring. It is thus possible to seal the inner space of the supporting portion from the inner space of the chamber to prevent the leakage of a gas in the inner space of the chamber to the outside of the chamber.

When the tubular supporting portion is joined with the back face of a ceramic heater and the temperature of the heater is elevated, however, fine cracks may be generated from the joining face of the heater to the supporting portion to induce gas leakage. The assignee filed a Japanese Patent publication 2001-250, 858A and disclosed a supporting portion having a shape of bellows joined with a ceramic heater, for providing a solution to the above problems.

SUMMARY OF THE INVENTION

It is provided that an electrical power is supplied to a heat resistance in a ceramic heater so that the average temperature of a heating surface reaches a desired target value, and the temperature on the heating surface is within a desired range at this time, as described above. When the ceramic heater is actually fitted to a chamber, however, it is needed to fix the heater onto a supporting portion and to fit the supporting portion to the chamber. In this case, however, the temperature of the ceramic heater reaches a temperature of, for example, 400° C. or higher. It is thus necessary to provide a cooling system between the supporting portion for the heater and chamber, for preventing excessive heating of the chamber.

It is now provided that the temperature on the heating face of the heater can be substantially constant at a target temperature. Even in this case, however, after the heater is fixed to the chamber, the temperature on the heating face may be lowered in the central part to induce cold spots. Such change of the temperature distribution depends on various conditions as follows. A supporting portion is used for fixing a ceramic heater on the wall of a chamber. The area and shape of the surface region of the heater contacted with the supporting portion may affect the temperature distribution. In addition to this, the temperature distribution may be affected by the thermal capacity of the supporting portion, the shape and thermal capacity of a chamber, the shape and cooling capacity of the cooling system, thermal reflection and absorption on the inner wall surface of a chamber, and the pressures and gas flow inside and outside of a chamber.

It may be considered to change a design of a heat resistor to increase the heat generation in the central part of the heating face, for preventing the cold spot observed in the central part. It is, however, impractical to change the design of the ceramic heater itself after the heater is fixed in the chamber.

It may be further considered to fine tune an electric power supplied to the heat resistor so that the temperature distribution on the heating face is reduced, after the ceramic heater is fixed to the chamber. Such control proves to be difficult in an actual system construction due to the following reason. That is, when the applied electric power to the heat resistor is increased or decreased, the whole heat generation is inevitably changed. Such change of the whole heat generation does not necessarily mean a reduction of the temperature distribution on the heating face and may result in an increase, after the heater is fixed in the chamber.

An object of the present invention is to provide a practical and low-cost method of reducing cold spots generated on the heating face of a ceramic susceptor and the temperature distribution when the susceptor is joined with a supporting portion at the back face and the supporting portion is fitted to a chamber through a cooling system.

The present invention provides a structure for supporting a ceramic susceptor in a chamber wherein the susceptor comprises a back face. The structure comprises a supporting portion provided on the side of the back face of the susceptor with an inner space formed therein separated from atmosphere in the chamber, a cooling system provided between the supporting portion and the chamber, and a thermal control portion provided between the cooling system and the supporting portion and for reducing a thermal conduction from the susceptor to the cooling system.

In a supporting system of escaping heat from a susceptor to a cooling system through, for example, a substantially cylindrical supporting portion, the inventors have reached the idea of providing a thermal control portion for reducing a thermal conduction from the susceptor to the cooling system at the upstream of the cooling system. It is thus possible to reduce cold spots observed in a part of the heating face of the susceptor, after the susceptor is fixed to the chamber. It is also possible to exclude the necessity of troublesome solutions such as the design change of the susceptor as described above.

These and other objects, features and advantages of the invention will be appreciated upon reading the following description of the invention when taken in conjunction with the attached drawings, with the understanding that some modifications, variations and changes of the same could be made by the skilled person in the art.

DETAILED DESCRIPTION OF THE INVENTION

Figure 1:
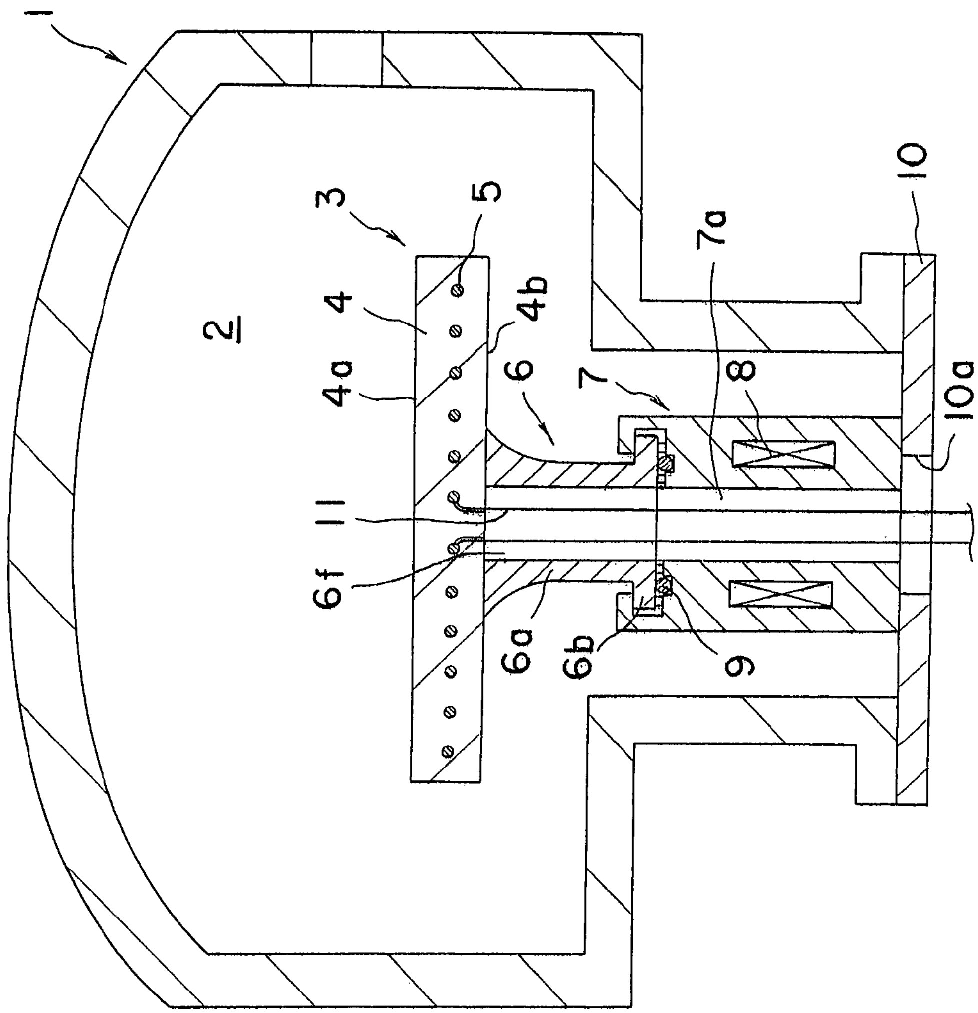
FIG. 1 is a cross sectional view schematically showing a supporting structure according to one embodiment of the present invention.
Figure 2:
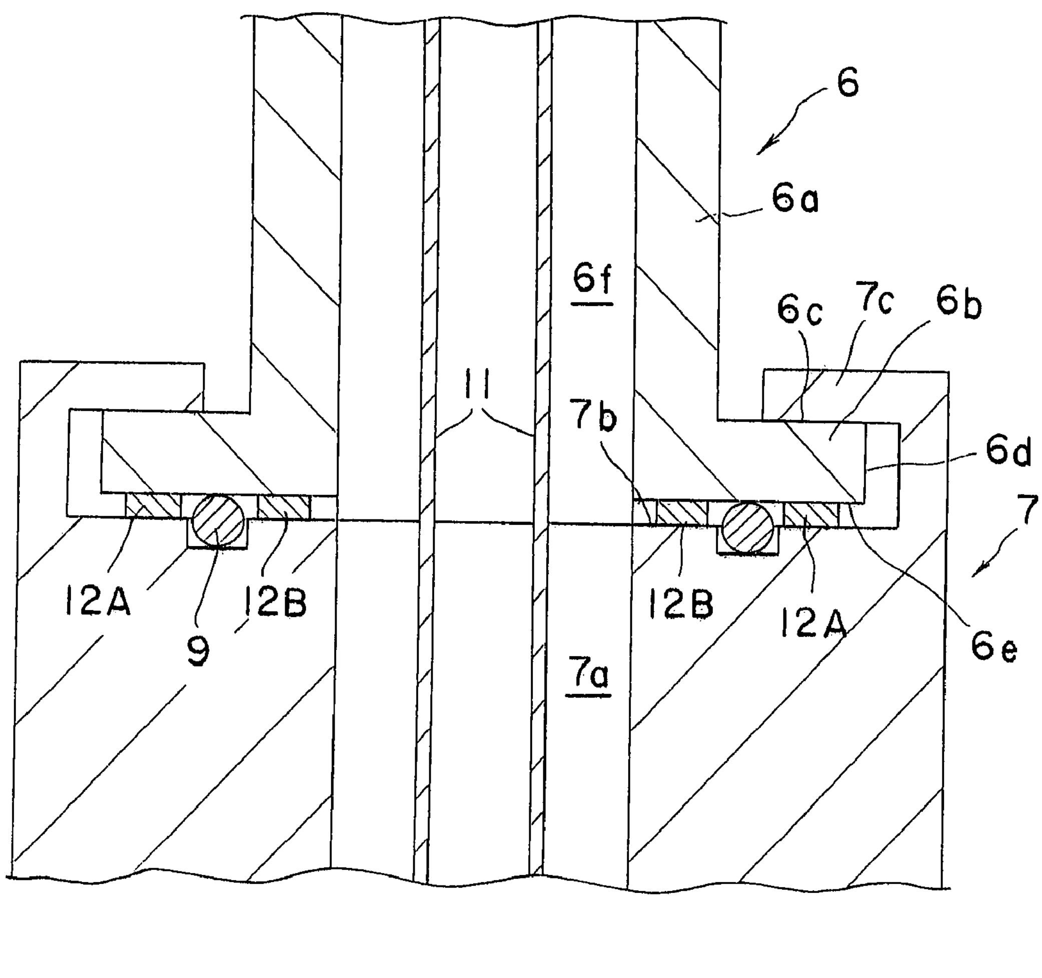
FIG. 2 is a cross sectional view showing an essential part of the supporting structure of FIG. 1 having heat insulating sheets 12A and 12B.

The present invention will be described further in detail, referring to the attached drawings. FIG. 1 is a cross sectional view schematically showing a supporting structure according to one embodiment of the present invention. FIG. 2 is a cross sectional view schematically showing the essential part thereof.

As shown in FIG. 1, a ceramic susceptor (ceramic heater in the present example) 3 has a substrate 4 and heat generator 5. 4*a* represents a heating face and 4*b* represents a back face. The susceptor 3 is contained and fixed in an inner space 2 of a chamber 1. The susceptor 3 is fixed onto a supporting portion 6 at the back face 4*b*. The supporting portion 6 has a substantially cylindrical main body 6*a*, and a flange portion 6*b* formed at the end of the main body 6*a*. An inner space 6*f* of the supporting portion 6 is separated from the atmosphere in the chamber 1. Although the supporting portion 6 is joined with the back face of the susceptor according to the present invention, the supporting portion and susceptor may be integrated as a single body.

A fixing portion 10 of the ceramic susceptor 3 is fixed to the chamber 1. An opening 10*a* is formed in the fixing portion 10. The fixing portion 10 has a base table 7, in which a cooling system 8 is contained. When the temperature of the susceptor 3 is heated at a high temperature, the temperature in the base table 7 containing the cooling system 8 is lowered as a whole to prevent excessive heating in the fixing portion 10. A member 11 for supplying electric power is connected to a heat generator 5 and provided through an inner space 6*f* of the supporting portion 6, an inner space 7*a* of the base table 7 and an opening 10*a* to the outside.

The connecting portion of the supporting portion 6 and base table 7 is shown in FIG. 2 as an enlarged view. A flange portion 6*b* is provided at the end portion of the supporting portion 6. The end face 6*e* of the flange portion 6*b* and end face 7*b* of the base table 7 are sealed with a sealing member 9. The sealing member 9 is, for example, an O-ring or gasket. According to the present example, a clearance is provided between an outer surface 6*d* of the flange portion 6*b* and base table 7. A pushing protrusion 7*c* of the base table 7 and flange face 6*c* of the flange portion 6*b* contact each other.

For example, a pair of heat insulating sheets 12A and 12B are provided between the end face 6*e* of the flange portion 6*b* and the end face 7*b* of the base table 7. According to the present example, the heat insulating sheets 12A and 12B are ring-shaped and provided concentrically in a plan view. A sealing member 9 is provided between the outer sheet 12A and inner sheet 12B.

Figure 3:
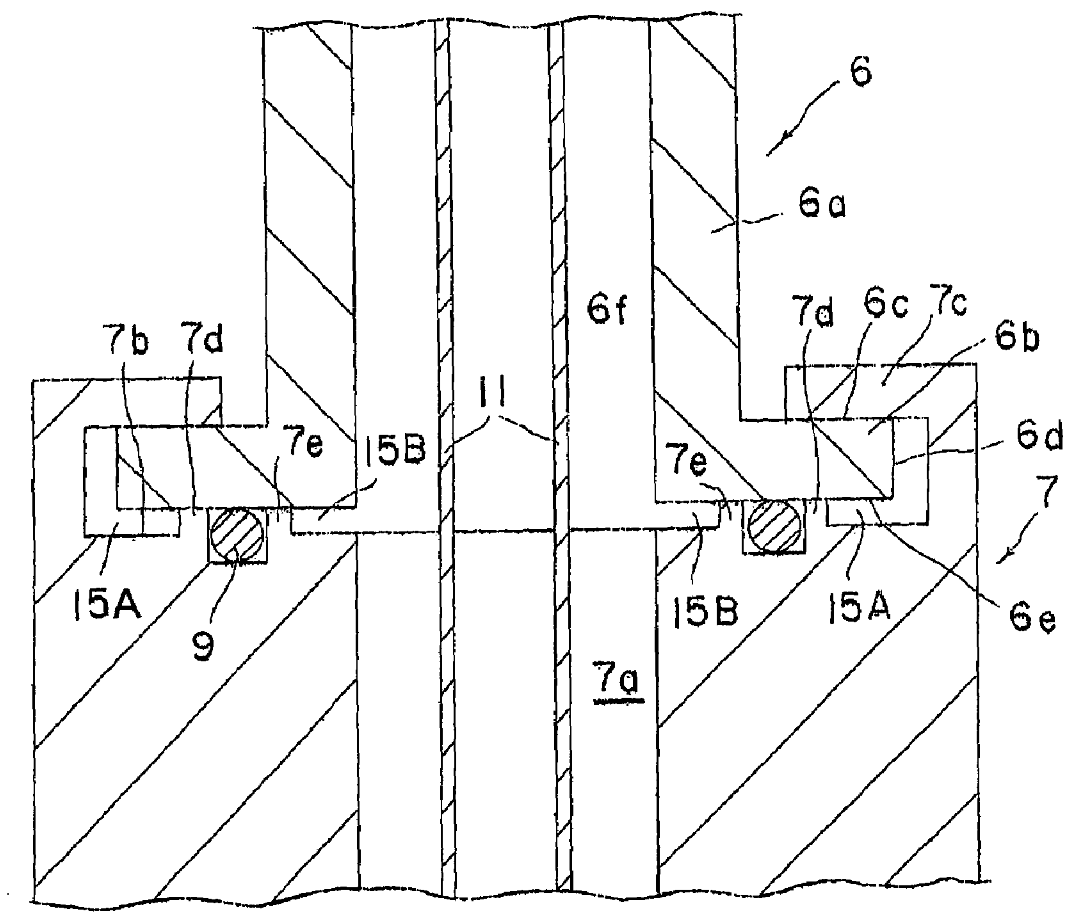
FIG. 3 is a cross sectional view showing an essential part of a supporting structure according to another embodiment of the present invention, with spaces 15A and 15B formed therein.

Further, in the example shown in FIG. 3, an outer ring shaped protrusion 7*d* and inner ring-shaped protrusion 7*e* are provided on the end face 7*b* of the base table 7. The ring shaped sealing member 9 is provided between the ring shaped protrusions 7*d* and 7*e*. A space 15B is further provided inside of the inner ring-shaped protrusion 7*e*, and a space 15A is provided outside of the outer ring-shaped protrusion 7*d*. The spaces 15A and 15B are provided so that the contact area of the end faces of the base table 7 and supporting portion 6 is made smaller to reduce the heat transfer from the supporting portion to the cooling system inside of the base table 7.

Further, according to a preferred embodiment, an intermediate holding member may be provided between the base table fixed to the chamber and supporting portion, and the cooling system may be provided inside of the base table. The thermal control portion is provided between the base table and intermediate holding member.

Figure 4:
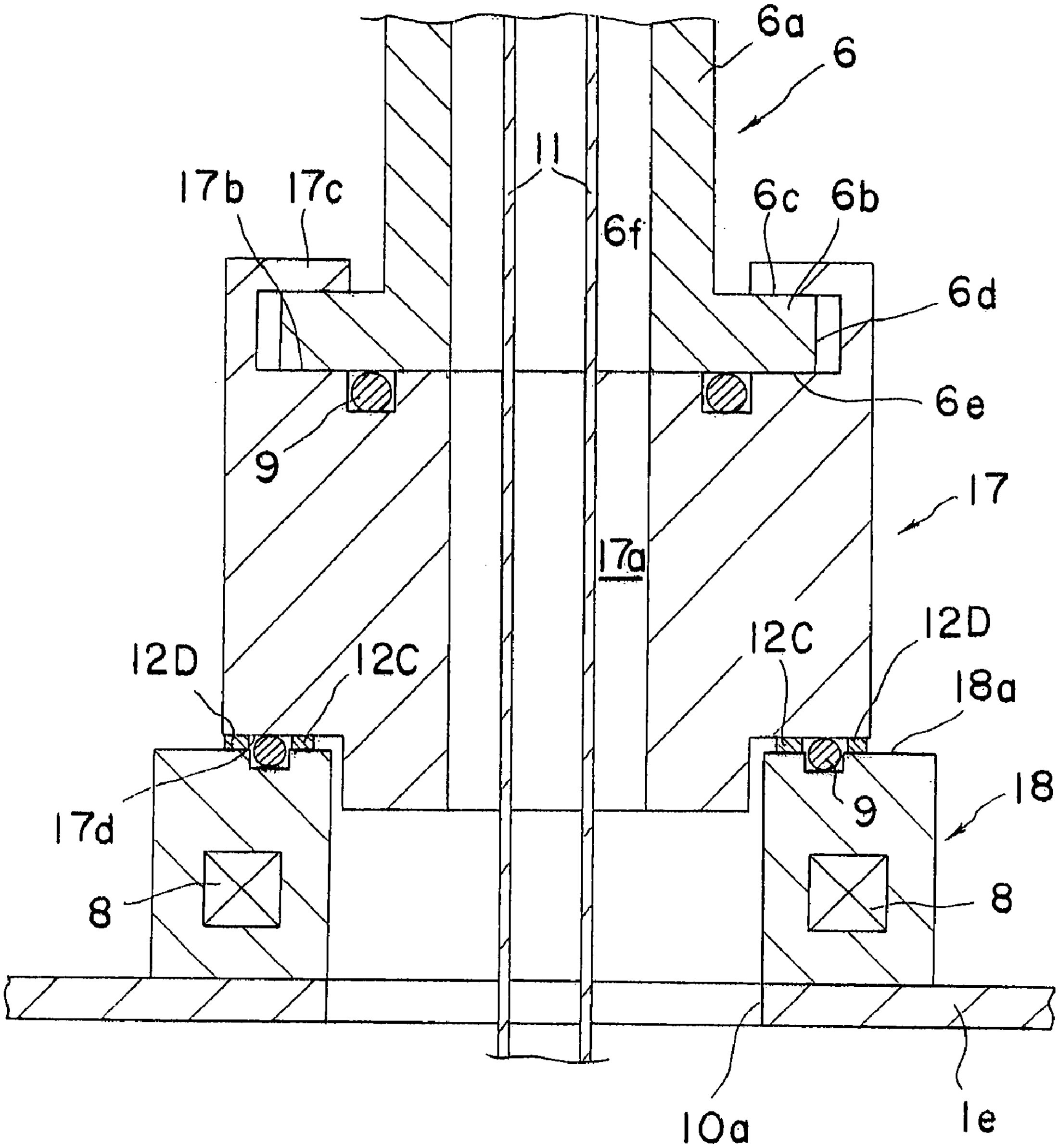
FIG. 4 is a cross sectional view showing an essential part of a supporting structure according to another embodiment of the present invention, having an intermediate holding member 17, a base table 18, and heat insulating sheets 12C and 12D provided therebetween.

FIG. 4 relates to this embodiment. According to the present embodiment, a substantially ring-shaped base table 18 is fixed onto the inner wall surface of the fixing portion 10 of the chamber. An intermediate holding member 17 is fixed onto the end face 18*a* of the base table 18, and the supporting portion 6 is fixed onto the intermediate holding member 17. The cooling system 8 is provided in the base table 18. The end face 18*a* of the base table 18 and the end face 17*d* of the intermediate holding portion 17 are sealed in an air-tight manner with a ring-shaped sealing member 9. A pair of ring-shaped heat insulating sheets 12C and 12D are provided between the end face 17*d* of the intermediate holding member 17 and the end face 18*a* of the base table 18. The heat insulating sheets 12C and 12D are provided concentrically and the sealing member 9 is provided therebetween. The end faces 17*b* and 6*e* contact each other, and the pushing member 17*c* contacts the flange face 6*c* 17*a* represents an inner space of the intermediate holding portion 17. Besides, the thermal control portion may be provided between the intermediate holding member 17 and supporting portion 6.

The material of the ceramic susceptor is not particularly limited and may be selected depending on applications. The material may preferably be a ceramics having resistance against a halogen based corrosive gas, and may more preferably be aluminum nitride or dense alumina, and most preferably be aluminum nitride ceramics or alumina having a relative density of 95 percent or more. A functional member such as a heat resistor, an electrode for electrostatic chuck and an electrode for generating plasma may be embedded in the susceptor.

The ceramic susceptor is an object heated with a heating source. Such heating source is not limited. The susceptor includes susceptors heated with an outer heat source (for example, an infrared ray lamp) and heated with an inner heat source (for example, a heater embedded in the susceptor).

The material for the supporting portion 6 is not particularly limited, and may preferably be a ceramics having corrosion resistance against a halogen-based corrosive gas, and more preferably be aluminum nitride or dense alumina.

The susceptor and supporting portion are joined with each other by any methods, including solid phase welding, solid-liquid phase welding, soldering and mechanical fixing using a fixing member such as a screw. The solid-liquid phase welding is a method described in Japanese patent publication 10-273370A.

A cooling medium usable in the cooling system 8 may be a liquid such as water, silicone oil or the like or a gas such as air, an inert gas or the like.

The type of thermal control portion for reducing thermal conduction from the susceptor to the cooling system is not particularly limited. In a preferred embodiment, the thermal control portion is composed of a heat insulating member. The shape of the heat insulating member is not limited, and may be a sheet, film or block. The heat insulating sheet includes the following:

(1) A sheet made of a heat insulating material; and (2) A sheet with foams or cavities therein, or sheet having surface irregularities.

The material constituting the heat insulating sheet is preferably selected from the following (resins) for example, including: a silicone resin; an epoxy resin; an acrylic resin; and a polyimide resin). Further, the cross sectional shape of the heat insulating member is rectangular in the examples shown in FIGS. 2 and 4, and may be a curved shape such as a complete round or elliptical.

The material of the base table or intermediate holding member is not particularly limited, and may preferably be a ceramic material having resistance against a halogen-based corrosive gas, and more preferably be aluminum nitride or dense alumina.

EXAMPLES

Example 1

The supporting structures shown in FIGS. 1 and 2 were produced. It was used a disk having a diameter of 150 mm, a thickness of 10 mm and made of aluminum nitride sintered body as the substrate 4 for the susceptor 3. The supporting portion 6 was shaped with a substantially cylindrical ceramic plate and had a length of 70 mm. The supporting portion 6 and susceptor 3 were joined with each other by solid-phase welding under the following conditions:

Pressure of atmosphere in furnace: 0.5 kg/cm$^2$; Maximum temperature: 2000° C.:

Holding time at the maximum temperature: 60 minutes; Pressure for joining: 0.5 to 1.0 kg/cm$^2$; and Joining material: Solution containing yttrium and acetic acid as the main components.

Figure 5:
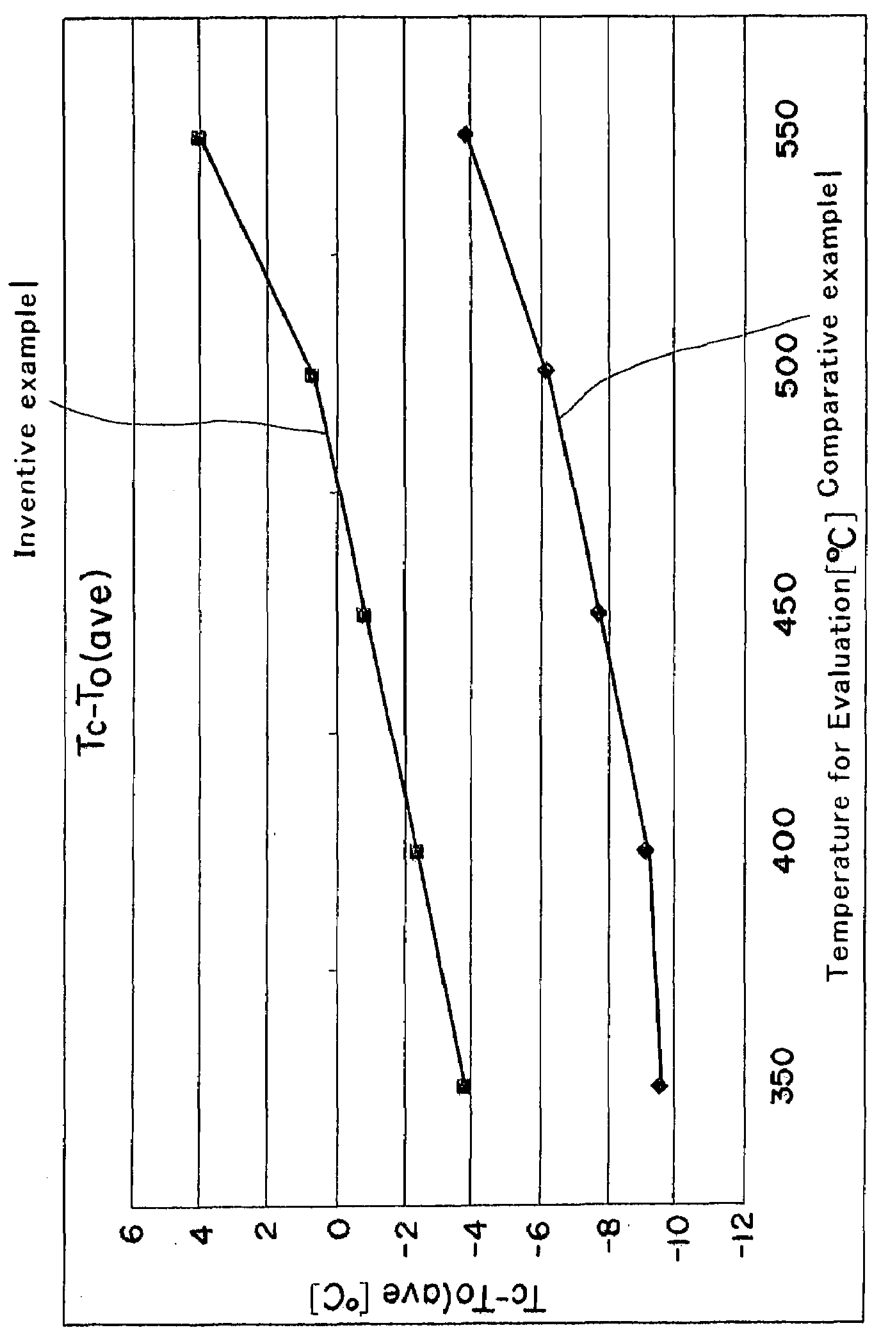
FIG. 5 is a graph showing temperature differences on a heating face according to the inventive example 1 and comparative example 1.

The supporting portion 6 is set on the base table 7, and they are then sealed in air-tight manner with an O-ring 9. A polyimide tape (Captone Tape supplied by 3M corporation: thickness of 50 to 100 μm) was cut out to form ring-shaped heat insulating sheets 12A and 12B. The inner space of the chamber is filled with nitrogen atmosphere of 10 Torr. Cooling water at 3° C. was flown into the cooling system 8. Electric power was supplied to the heat generator 5 to elevate the temperature on the heating face 4*a*. The rate of elevating temperature was controlled at 100° C./minute. The temperature distribution on the heating face was measured by means of a radiation thermometer at 350, 400, 450, 500 and 550° C. The temperature "Tc" at the center of the heating face and the average temperature "To (ave)" at a circle having a diameter of 138 mm with respect to the center of the heating face were measured. The difference of "Tc" and "To (ave)" was then calculated and shown in FIG. 5.

Comparative Example 1

A supporting structure of a ceramic susceptor was produced according to the same procedure as the example 1, except that the heat insulating sheets 12A and 12B were not provided. The temperature distribution on the heating face of the thus obtained ceramic susceptor was measured according to the same procedure as the example 1, and shown in FIG. 5.

As can be seen from the results, according to the present invention, it is possible to maintain the temperature difference on the heating face as a whole at a low level, when the temperature on the heating face is changed.

Inventive Example 2

The supporting structure for the ceramic susceptor was produced according to the same procedure as the inventive example 1. In the present example, the heat insulating sheets 12A and 12B were not provided and, instead, the supporting structure shown in FIG. 3 was applied. As a result, the results substantially same as the inventive example 1 were obtained.

As described above, according to the present invention, it is possible to provide a practical and low-cost method for reducing cold spots observed on the heating face of a ceramic susceptor and temperature distribution on the heating face, when a supporting portion is joined with the back face of the susceptor and is fixed to a chamber through a cooling system.

The present invention has been explained referring to the preferred embodiments. However, the present invention is not limited to the illustrated embodiments which are given by way of examples only, and may be carried out in various modes without departing from the scope of the invention.

What is claimed is:

1. A support structure for supporting a ceramic susceptor in a chamber, said support structure comprising:
- a supporting portion provided on a side of a back face of said susceptor and including an inner space formed therein that is separated from an atmosphere of the chamber;
- a cooling system provided below said supporting portion; and
- a thermal control portion provided above said cooling system and below said supporting portion and for reducing thermal conduction from said susceptor to said cooling system.

2. The support structure of claim 1, further comprising a base table fitted to said chamber, wherein said cooling system is provided in said base table, and wherein said thermal control portion is provided between said base table and said supporting portion.

3. The support structure of claim 1, further comprising a base table fitted to said chamber and an intermediate holding member fitted to said supporting portion, wherein said cooling system is provided in said base table, and wherein said thermal control portion is provided between said base table and said intermediate holding member.

4. The support structure of claim 1, wherein said thermal control portion comprises a heat insulating member.

5. The support structure of claim 4, wherein said heat insulating member comprises a heat insulating sheet.

6. The support structure of claim 1, wherein said thermal control portion comprises a space.

7. The support structure of claim 1, wherein said ceramic susceptor comprises a heater.

8. A support structure for supporting a ceramic susceptor in a chamber, said support structure comprising:
- a supporting portion comprising a substantially cylindrical main body extending from a first end in contact with a back face of said susceptor toward an opposed second end and surrounding a central space that is separated from an atmosphere of the chamber;
- a cooling system provided below said supporting portion;
- a thermal control portion provided above said cooling system and below said supporting portion and for reducing a thermal conduction from said susceptor to said cooling system; and
- a discrete base table having a first portion that is fitted to said second end of said supporting portion and having a second portion that is fitted to the chamber;

wherein said cooling system is provided between said support portion and an opening in the chamber.

* * * * *